United States Patent [19]

Phan et al.

[11] Patent Number: 5,059,827
[45] Date of Patent: Oct. 22, 1991

[54] ECL CIRCUIT WITH LOW VOLTAGE/FAST PULL-DOWN

[75] Inventors: M. Nghiem Phan, Mesa; William R. Blood, Jr., Phoenix, both of Ariz.

[73] Assignee: Motorola, Inc., Schaumburg, Ill.

[21] Appl. No.: 560,916

[22] Filed: Jul. 31, 1990

[51] Int. Cl.$^5$ ..................... H03K 19/06; H03K 19/02
[52] U.S. Cl. .................................. 307/455; 307/446; 307/456; 307/263; 307/355; 307/530
[58] Field of Search ............... 307/443, 446, 455–456, 307/263, 355, 530

[56] References Cited

U.S. PATENT DOCUMENTS

4,724,343  2/1988  Le Roux et al. ..................... 307/446
4,755,693  7/1988  Suzuki et al. ........................ 307/455
4,939,393  7/1990  Petty ................................... 307/455

Primary Examiner—Stanley D. Miller
Assistant Examiner—Margaret Rose Wambach
Attorney, Agent, or Firm—Joe E. Barbee

[57] ABSTRACT

A logic circuit having an emitter-follower output stage utilizes an active pull-down. An inverter stage generates a signal which drives the active pull-down, eliminating the need to identify a complementary signal in a complex logic implementation. A pre-biasing scheme for the active pull-down provides for fast turn on of the active pull-down device while eliminating the temperature and voltage dependency of the pre-biasing function. Power dissipation is minimized by operating the active pull-down and the pre-biasing network from a reduced power supply voltage.

15 Claims, 5 Drawing Sheets

ECL CIRCUIT WITH LOW VOLTAGE/FAST PULL-DOWN

BACKGROUND OF THE INVENTION

The present invention relates, in general, to bipolar logic circuits and, more particularly, to an emitter-coupled logic (ECL) gate having an output with active pull-up and low-voltage active pull-down circuitry for use in conjunction with bipolar logic circuits in macrocell-based application specific integrated circuits (ASIC).

Historically, one of the most important advantages to bipolar emitter-coupled logic has been switching speed. In most bipolar logic families, the transistors are operated between a non-conductive state and a highly conductive state in or near the saturation region. It takes a finite amount of time to switch a transistor from off to on. Once the transistor is on, it takes a finite amount of time to turn it off by dissipating the charge that builds up in the base of the device. Additionally, in other logic forms, the total voltage swing is relatively large, thus increasing the delay between input and output transitions. In a complex logic function, these time delays can become significant. With ECL, the transistors in the circuit are operated in the active region, reducing the delays associated with turning on or turning off a device. Furthermore, the total voltage swing is relatively small, thus improving switching speed.

The penalty paid with high speed ECL is that of increased power dissipation. In traditional ECL, the output device was an emitter follower transistor acting as a pull-up device for the output load. The pull-down function was performed by a resistor. The resistor had to be of small enough value so that it could discharge the capacitance associated with the output load with reasonable speed. In a quiescent state, whether the output was high or low, the pull down resistor continued to sink current, which was sourced by the pull-up device. The total quiescent power dissipation of this emitter follower output section was then the sum of the power dissipated in the pull up device due to the quiescent current and the power dissipated in the pull down resistor. This power dissipation component contributed significantly to the total power dissipation of the ECL circuit.

An improved ECL implementation used a current source as a pull-down. This had the advantage of having a linear decay characteristic, rather than the characteristic exponential decay of the RC network, thus making switching speed less sensitive to voltage variations. However, the current source still had to be a relatively large value in order to maintain the desired switching speed. Thus, the problem of high power dissipation still remained.

Another approach used a technique to temporarily turn on an active pull-down device. During switching, the current sinking capability of the output was enhanced, increasing switching speed. During steady state conditions, the circuit was off, reducing power dissipation. This scheme was primarily based upon deriving a "boost" signal from the output of the input differential amplifier. The input differential amplifier normally had two outputs, one the inverse of the other. One was used to drive the output stage of the logic gate. The other was capacitively coupled to the pull-down device, giving it a transient increase in base drive during the time the output logic was being switched to a lower voltage level. There were some disadvantages to this approach. First, the two outputs of the input stage would not necessarily have matching switching characteristics. Further, the switching characteristics of the outputs of the input stage could vary from one logic function to another. The effect was an inconsistency in the results of the active pull-down function. Another disadvantage was that, in macrocell-based ASIC circuits, the complex structure of the macro logic function often made the complementary outputs of the input differential amplifier difficult and costly to realize.

SUMMARY OF THE INVENTION

The objects and advantages of the present invention are to provide an improved scheme for a fast and consistent active pull-down for ECL logic circuits, with reduced power dissipation. The invention includes an input stage which drives an output stage, an inverter stage which generates a signal complementary to the output of the input stage, an active pull-down stage which is driven to a more highly conductive state when the output of the inverter stage is transitioning from a lower to a higher voltage level, and a scheme for prebiasing the active pull-down to a quiescent slightly conductive state, providing for faster response of the active pull-down. The invention further provides that the active pull-down and pre-biasing circuitry function at a reduced power supply level, thus minimizing power dissipation.

DETAILED DESCRIPTION OF THE DRAWINGS

Figure 1:
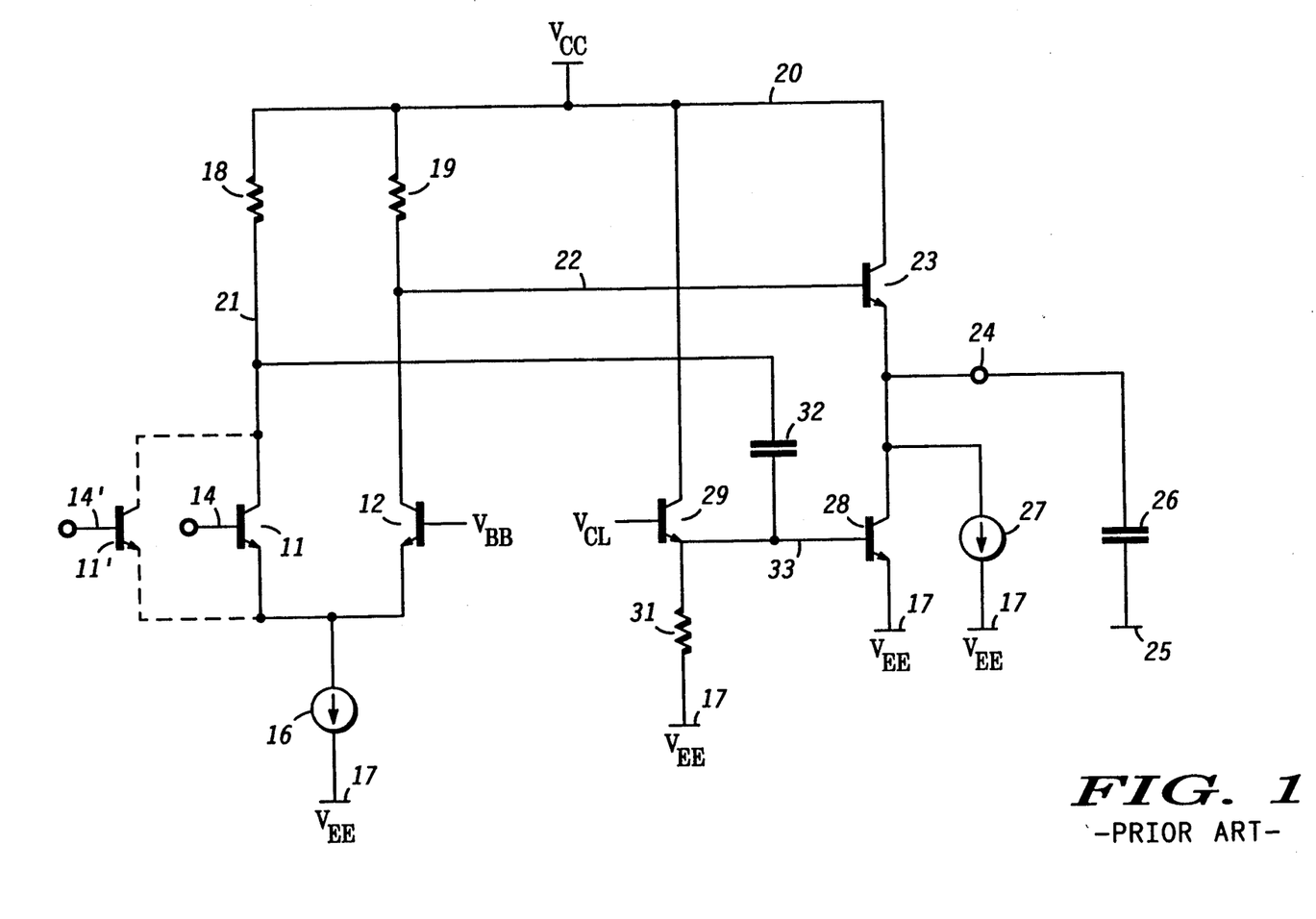
FIG. 1 is a schematic diagram illustrating a prior art ECL gate circuit.

The discussion of the present invention begins with a review of a prior art logic gate illustrated in FIG. 1. Referring to FIG. 1, the input stage of the prior art ECL gate comprises NPN transistors 11 and 12, which, along with resistors 18 and 19 and current source 16, constitute a differential amplifier. The base of transistor 12 is coupled to a reference voltage $V_{BB}$, while the base of transistor 11 is connected to input node 14. When a signal higher in value than Vss is presented to input node 14, transistor 11 is "on", or in a conductive state, while transistor 12, whose emitter is connected both to the emitter of transistor 11 and to one end of current source 16, is "off", or in a non-conductive state. Resistor 18 is connected between positive voltage supply terminal, node 20 ($V_{cc}$), and the collector of transistor 11, node 21. The current flowing in current source 16 thus flows through transistor 11 and resistor 18. The second end of current source 16 connects to a negative 5.2V voltage supply terminal, node 17 ($V_{EE}$). The resultant voltage drop across resistor 18 causes the voltage level on node 21 to decrease. Node 21 is the "complementary" output of the input stage. Meanwhile, resistor 19 is connected between $V_{cc}$ node 20 and the collector of transistor 12, node 22. Since transistor 12 is off, node 22 is pulled up to the voltage on node 20 by resistor 19. Node 22 is the "true" (non-complementary) output of the input stage, and connects to the base of output transistor 23. Since node 22 is at a relatively high voltage level, transistor 23, whose collector connects to $V_{cc}$ node 20, is in a highly conductive state. Output terminal 24, which connects to the emitter of transistor 23, is thus in a logic high state, charging load capacitor 26, which connects between output terminal 24 and reference terminal 25. In this state, output transistor 23 sources sufficient current to overcome the discharge capability of current source 27, which connects between the emitter of transistor 23 and $V_{EE}$ node 17. In this circuit configuration, the collector of transistor 28 connects to output node 24 to give a boost to the discharge capability of the output stage when the input logic level transitions low. The emitter of transistor 28 connects to $V_{EE}$ node 17. When output node 24 is at a logic high state, transistor 28 is pre-biased by transistor 29, the emitter of which connects to the base of transistor 28, which is designated as node 33, and to one end of resistor 31.

The other end of resistor 31 connects to $V_{EE}$ node 17. The base of transistor 29 is coupled to a bias voltage $V_{cL}$, set at a level such that transistor 28 is biased just below turn on. The collector of transistor 29 connects to $V_{cc}$ node 20.

When the signal presented to input node 14 transitions to a voltage level lower than $V_{BB}$, transistor 11 turns off and transistor 12 turns on. As current begins to flow through transistor 12 and resistor 19, the resultant voltage drop across resistor 19 causes the voltage level on node 22 to decrease, causing transistor 23 to become less highly conductive. Load capacitor 26 can now begin to discharge through current source 27, allowing node 24 to begin to follow node 22. At the same time, because transistor 11 has turned off, node 21 is pulled high by resistor 18. Capacitor 32 is connected between node 21 and node 33. Since the voltage across a capacitor cannot change instantaneously, the increase in the voltage level on node 21 is transferred to node 33, giving a momentary increase in the base current of transistor 28. Transistor 28 turns on, discharging load capacitor 26. Once node 21 reaches a steady state, capacitor 32 ceases to conduct, and transistor 28 returns to its quiescent pre-biased state. At this point, current source 27 serves the purpose of pulling a small trickle current out of the emitter of transistor 23. This maintains transistor 23 in a slightly conductive state, providing for greater switching speed for the next output low to output high transition. Note that the input differential amplifier could be connected in a full differential input configuration by connecting the base of transistor 12 to the complement of the input signal on node 14. The description of the function of the circuit with such a configuration would remain unchanged.

The above described circuit has a number of limitations. First, current source 27, which is connected to $V_{EE}$ node 17, conducts constantly. Transistor 28 and resistor 31 also connect to $V_{EE}$ node 17. This contributes to a significant minimum power dissipation.

Another limitation of the prior art is that the logic gate will likely have a multiplicity of inputs, 25 represented in FIG. 1 by node 14', connecting to the bases of multiple input transistors, represented in FIG. 1 by transistor 11', with emitters and collectors connected in common with transistor 11. Each of these transistors has parasitic capacitance associated with its collector. Therefore, the rise time of node 21 will be slow compared to node 22. Additionally, different applications will have different input configurations, leading to a lack of consistency in performance from one application to the next. Further, since the rise time of node 21 is relatively slow, the value of capacitor 32 will have to be made relatively large.

Another limitation associated with the prior art is that, in complex logic functions implemented in integrated macrocell format, the complementary output of the input stage may not be available. This would occur in a function such as a full adder, where the true and complementary outputs of several different inputs are combined logically internally to the macrocell before producing an output. There then exists no signal internal to the logic which is of the appropriate sense to properly drive transistor 28.

Another limitation of the prior art is the prebiasing scheme comprising transistor 29 and resistor 31. The voltage at the base of transistor 28 is biased below its turn-on point, as evidenced by the need for current source 27, and will require some delay time to turn on. Thus the speed advantage of the circuit is reduced.

Figure 2:
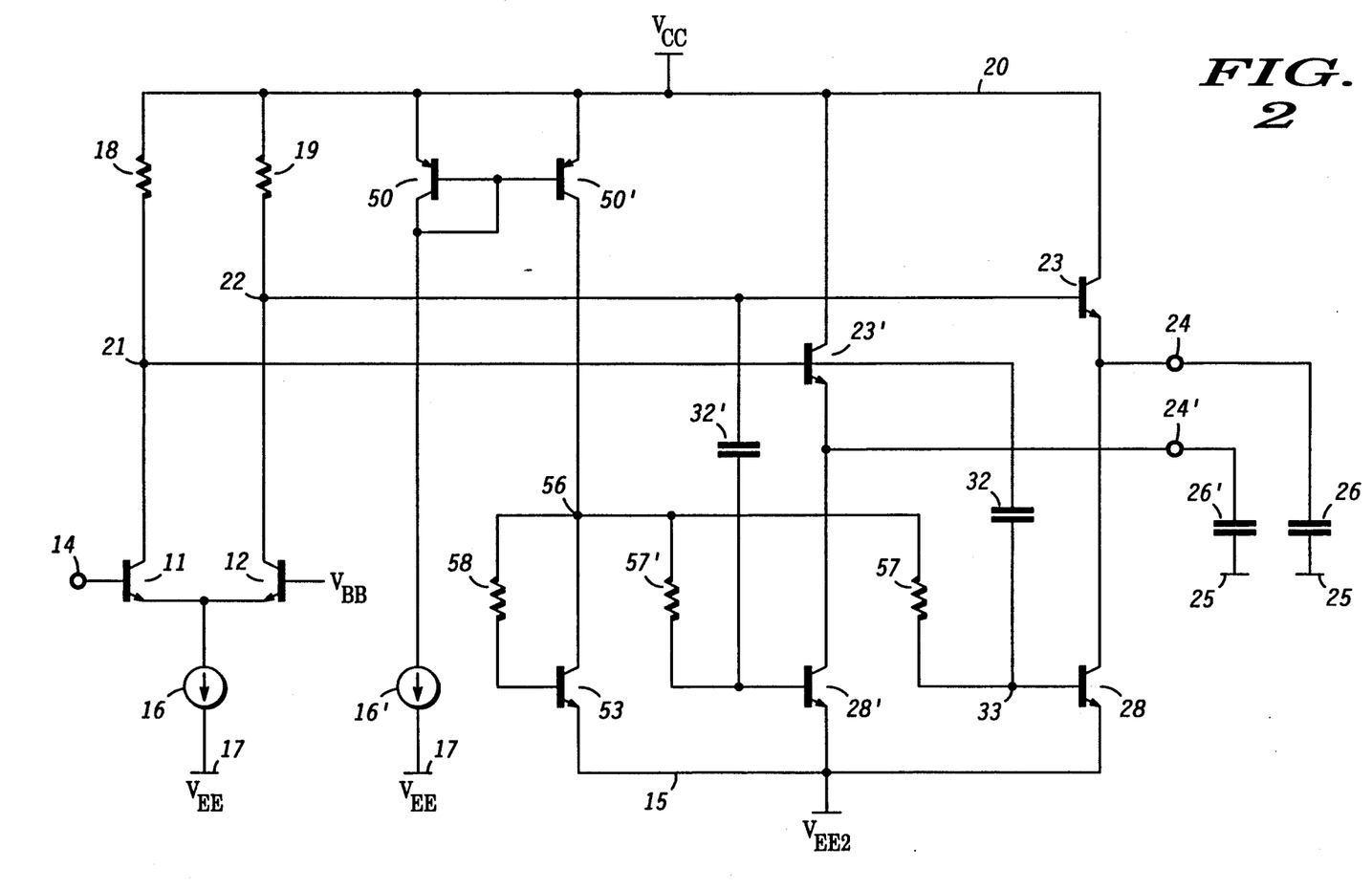
FIG. 2 is a schematic diagram of an ECL gate circuit with a low voltage output pull-down stage.

The present invention addresses these limitations. FIG. 2 is a schematic diagram of an embodiment of the present invention showing the connection of the active pull-down section to a negative two (2) volt voltage supply, node 15 ($V_{EE2}$). A dual-ended output consisting of nodes 24 and 24' is shown. The collector of complementary output pull-up transistor 23' couples to $V_{CC}$ node 20, while the base of transistor 23' couples to node 21. The emitter of transistor 23' couples to complementary output node 24' and to the collector of active pull-down transistor 28'. The load on node 24' is represented by capacitor 26', connected from node 24' to node 25. The base of transistor 28' is coupled to node 22 by capacitor 32. The operation of the input, output, and active pull-down sections is essentially the same as in the circuit of FIG. 1. The major differences are the connection to $V_{EE2}$ node 15 and the elimination of current source 27. The trickle current for transistor 23 (and 23') is sunk by transistor 28 (and 28').

The pre-bias function for transistor 28 provided by transistor 29 and resistor 31 in FIG.1 is replaced in FIG. 2 by a current set up by current source 16'. Current source 16' connects between the base-collector short of transistor 50 and $V_{EE}$ node 17. The emitter of transistor 50' connects to $V_{cc}$ node 20. The emitter of transistor 50' also connects to $V_{cc}$ node 20, while the base of transistor 50' connects to the base-collector short of transistor 50. Thus, the current in transistor 50 is mirrored by transistor 50'. The collector of transistor 53 connects to the collector of transistor 50' through node 56. Resistor 58 couples the base of transistor 53 to node 56, while the emitter of transistor 53 connects to $V_{EE2}$ node 15. Therefore, a reference current substantially equal to the collector current of transistor 50' flows in transistor 53. Since the base of transistor 28 is coupled to node 56 by resistor 57, and the base of transistor 28' is coupled to node 56 by resistor 57', the reference current in transistor 53 is mirrored by transistor 28 and transistor 28', providing the trickle current for transistor 23 and transistor 23'.

The emitters of transistor 28 and transistor 28' are connected to $V_{EE2}$ node 15 instead Of $V_{EE}$ node 17. Since the voltage on output node 24 swings from a negative nine tenths of a volt for a logic high to a negative one and a half volts for a logic low, the average voltage drop across transistor 28 and current source 27 in FIG. 1 is four volts. The average voltage drop across transistor 28 in FIG. 2 is eight tenths of a volt. Quiescent power dissipation for the pull-down stage is thus reduced by a factor of five.

Figure 3:
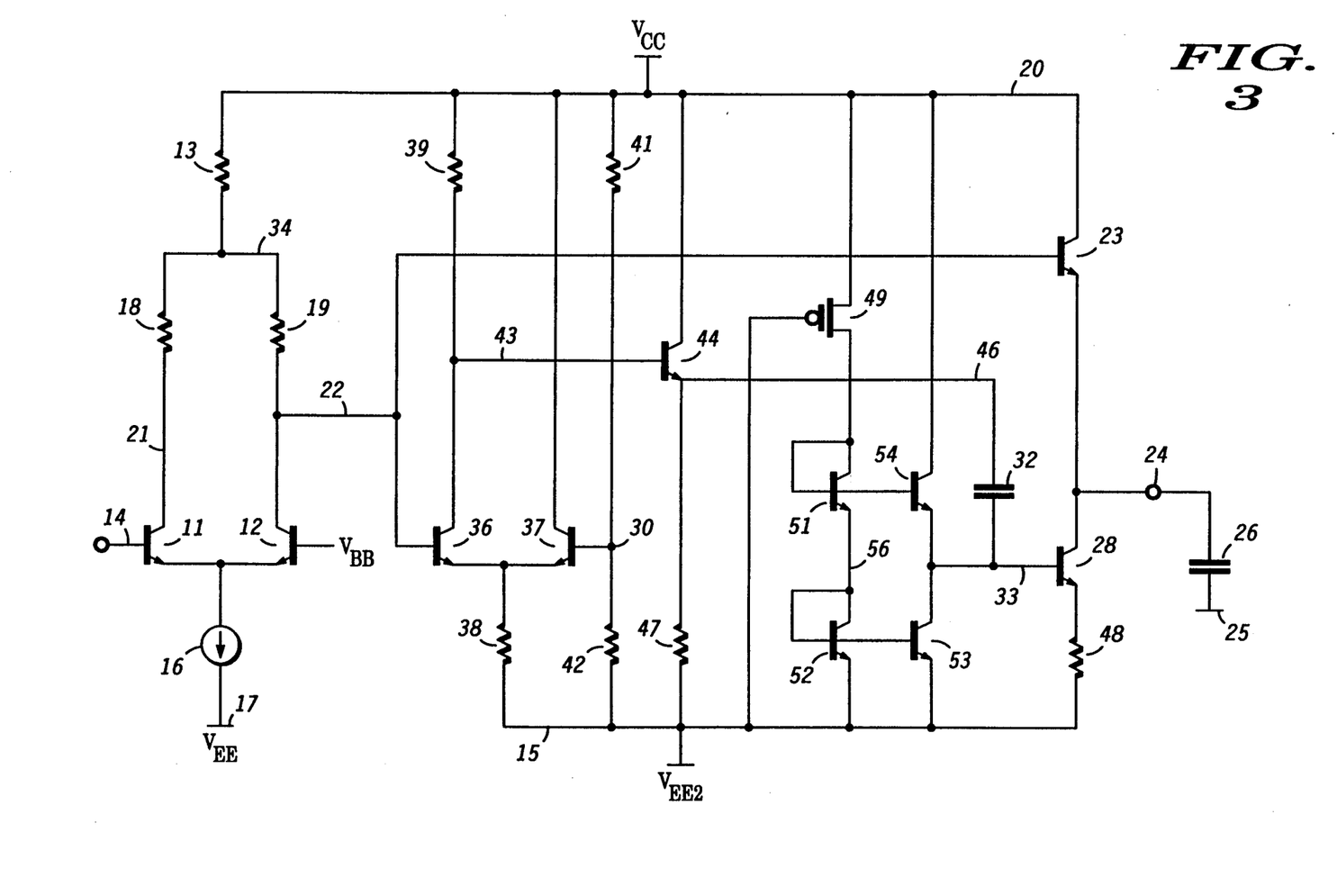
FIG. 3 is a schematic diagram of an ECL gate circuit including an inverter coupled to the input stage.

Once reduction in power dissipation is achieved, it is necessary to address the limitations which the prior art placed upon driving the active pull-down. FIG. 3 illustrates the addition of an inverter stage to generate the inverse signal required to drive the active pull-down. The input stage functions much the same as that described in FIG. 1. The difference is the addition of resistor 13, connecting between $V_{CC}$ node 20 and node 34. Resistors 18 and 19 also connect to node 34. This establishes a voltage on node 34, defining a voltage level to which node 22 rises when the ECL gate is in a logic high state.

Transistors 36 and 37 and resistors 38, 39, 41, and 42 constitute an inverter whose output, node 43, is of the opposite logic polarity of node 22. Resistor 41 connects between $V_{CC}$ node 20 and one end of resistor 42, forming a voltage divider that establishes a reference voltage on node 30. The second end of resistor 42 connects to $V_{EE2}$ node 15. Node 30 connects to the base of transistor 37. The emitters of transistors 36 and 37 are connected together so that when the voltage on node 22, which connects to the base of transistor 36, is lower than the voltage on node 30 at the base of transistor 37, transistor 36 is off and transistor 37 is on. Current flows through transistor 37, through resistor 38, which connects to the common emitter connection of transistors 36 and 37, to $V_{EE2}$ node 15, where the second end of resistor 38 connects. Since transistor 36 is off, the current through resistor 39, which connects from $V_{cc}$ node 20 to the collector of transistor 36, node 43, is reduced to only the base drive of emitter follower 44, which also connects to node 43. Node 43 is thus pulled to a relatively high voltage level by resistor 39. Conversely, when the voltage on node 22 is higher than the voltage at the base of transistor 37, transistor 36 begins to conduct while transistor 37 begins to turn off. The collector current of transistor 36 flows through resistor 39, causing a decrease in the voltage level on node 43. Thus, a signal which is the inverse of the signal on node 22 is always available on node 43, regardless of the complexity of the input logic function which generates the signal of node 22. The switching speed of the inverted signal of node 43 is also independent of the the logic gate input configuration, i.e. the number of input transistors 11.

The voltage on node 43 is level-shifted down by emitter follower 44, whose collector is connected to $V_{cc}$ node 20. The emitter of emitter follower 44 is connected to node 46, which is also the connection for one end of capacitor 32 and of resistor 47, whose other end connects to $V_{EE2}$ node 15. The second end of capacitor 32 connects to the base of transistor 28 and to the collector of transistor 53.

A negative transition on node 22, in addition to trying to turn output transistor 23 off, will cause the voltage level on node 43 to rise, as discussed above. This will cause a corresponding rise in the voltage level on node 46, and thus node 33, which causes more base current to flow in transistor 28. The current available as base drive to transistor 28 is supplied by emitter follower 44 rather than resistor 39, contributing to faster switching speeds on node 43, allowing capacitor 32 to be of a smaller value, and providing for greater current sink capability by transistor 28. The current sink capability of active pull-down transistor 28 is subsequently controlled by connecting current limiting resistor 48 from the emitter of transistor 28 to $V_{EE2}$ node 15. Resistor 48 has a value in the range of fifty to one hundred ohms.

Transistor 28 is pre-biased to a slightly conductive state by current source 49 and transistors 51, 52, 53, and 54. Current source 49 is depicted in FIG. 3 as a PMOS transistor operated in the saturation region. The source of current source 49 connects to $V_{CC}$ node 20, the gate to $V_{EE2}$ node 15, and the drain to the shorted base and collector of transistor 51, sourcing ten to fifty microamps of current to transistor 51. The current then flows through transistor 52, whose base and collector connect to the emitter of transistor 51, to $V_{EE2}$ node 15, where the emitter of transistor 52 is connected. Because the base of transistor 53 is connected to the base of transistor 52 and the emitter of transistor 53 is connected to $V_{EE2}$ node 15, the current in transistor 52 is mirrored by transistor 53. The collector of transistor 53 is connected to the emitter of transistor 54. Thus the collector current in transistor 53 is pulled from the emitter of transistor 54, meaning that the currents in transistors 51, 52, 53, and 54 are equal. Therefore, the $V_{EE}$s of transistors 51, 52, 53, and 54 are equal. It follows then, that since the base of transistor 54 is connected to the base of transistor 51, the collector of transistor 54 being connected to $V_{CC}$ node 20, the voltage on node 33 is equal to the voltage on node 56. This means that the voltage at the base of transistor 28 is equal to the voltage at the bases of transistors 52 and 53. A current in transistor 28 is thus established. If transistor 28 is the same size as transistors 51, 52, 53, and 54, and neglecting the effect of low-valued resistor 48, the current in transistor 28 will be the same ten to fifty microamps as in transistor 53. This compares to a typical current in output transistor 23 of one milliamp, and therefore output terminal 24 will rise fast, as described previously.

The advantage of the described pre-biasing circuit is that there is no temperature or voltage dependency. Though $V_{BE}$s vary with temperature, the current of current source 49 is relatively constant, providing for a consistent pre-bias point for transistor 28. An additional advantage is that the pre-biasing circuit, as well as the inverter stage and active pull-down transistor 28 all work at a supply voltage, $V_{EE2}$, independent of that of the input stage, $V_{EE}$. The independent supply voltage can be less than half the supply voltage of the input stage, typically 2V as compared to 5.2V for the input stage. This serves to aid in the overall reduction of power dissipation.

Figure 4:
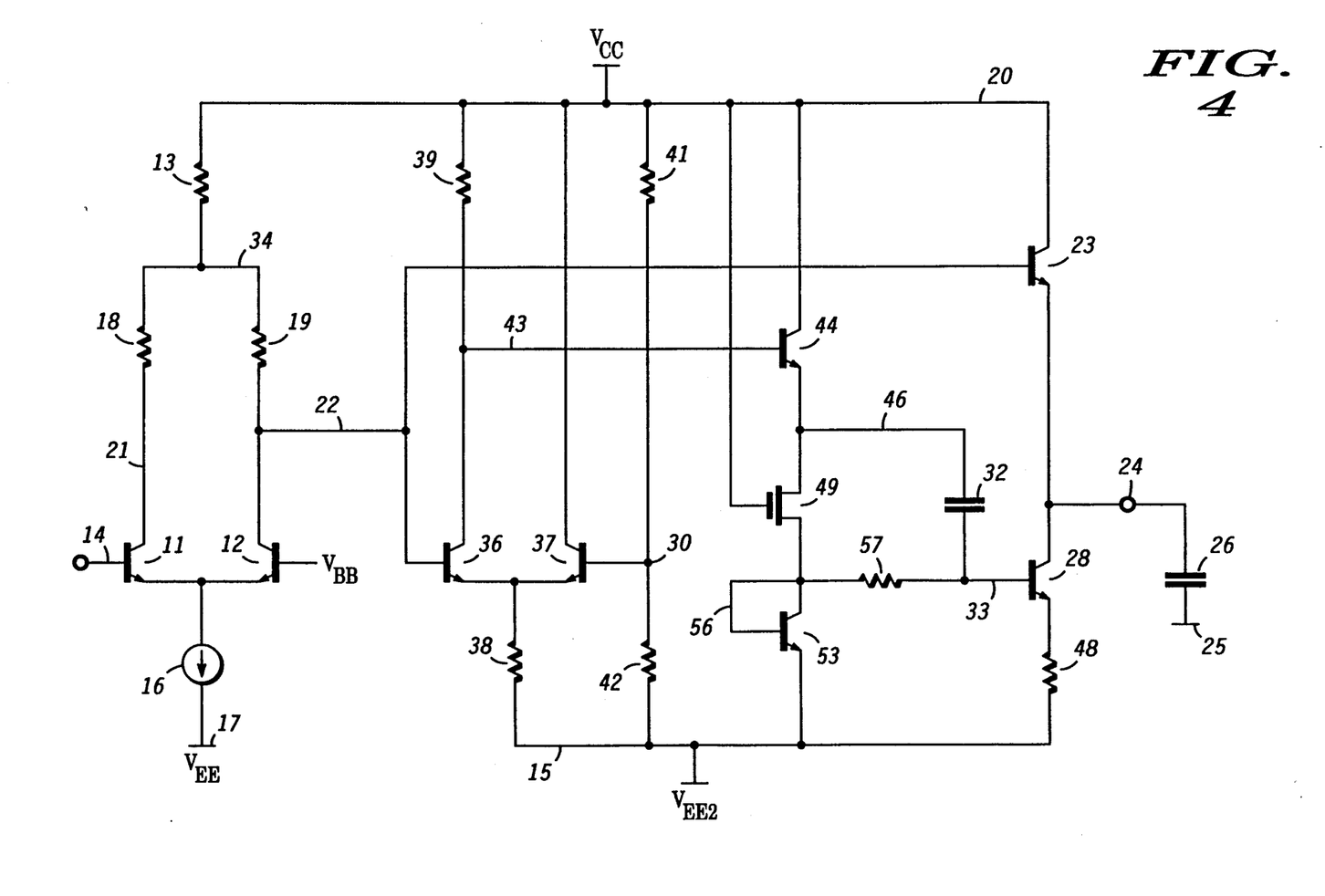
FIG. 4 is a schematic diagram of an ECL gate circuit including an alternate embodiment of the circuit of FIG. 3.

An alternate embodiment of the present invention is illustrated in FIG. 4. The operation of the input stage, inverter stage, and output active pull-up and pull-down devices is identical to FIG. 3. The difference is in the realization of the pre-biasing function. Current source 49 is depicted in FIG. 4 as an NMOS transistor operating in the saturation region, with its source connected to node 56, its gate connected to $V_{CC}$ node 20, and its drain connected to node 46. Ten to fifty microamps is sourced into the shorted base and collector of transistor 53, which connect too node 56. This sets up a reference voltage on node 56. Resistor 57, connecting from node 56 to node 33, serves to provide isolation between capacitor 32 and transistor 53 such that when capacitor 32 pulls node 33 high, the current sourced by capacitor 32 is presented as base drive to transistor 28 rather than as collector current to transistor 53. In the quiescent state, however, the only current flowing through resistor 57 is base drive to transistor 28. The voltage on node 33 will thus be about equal to the voltage on node 56. The quiescent current of transistor 28 will then be about equal to the ten to fifty miroamps of transistor 53. This current will be relatively immune to variations in temperature, responding more to variations in current from current source 49 than to variations in $V_{BE}$s or resistor values.

Figure 5:
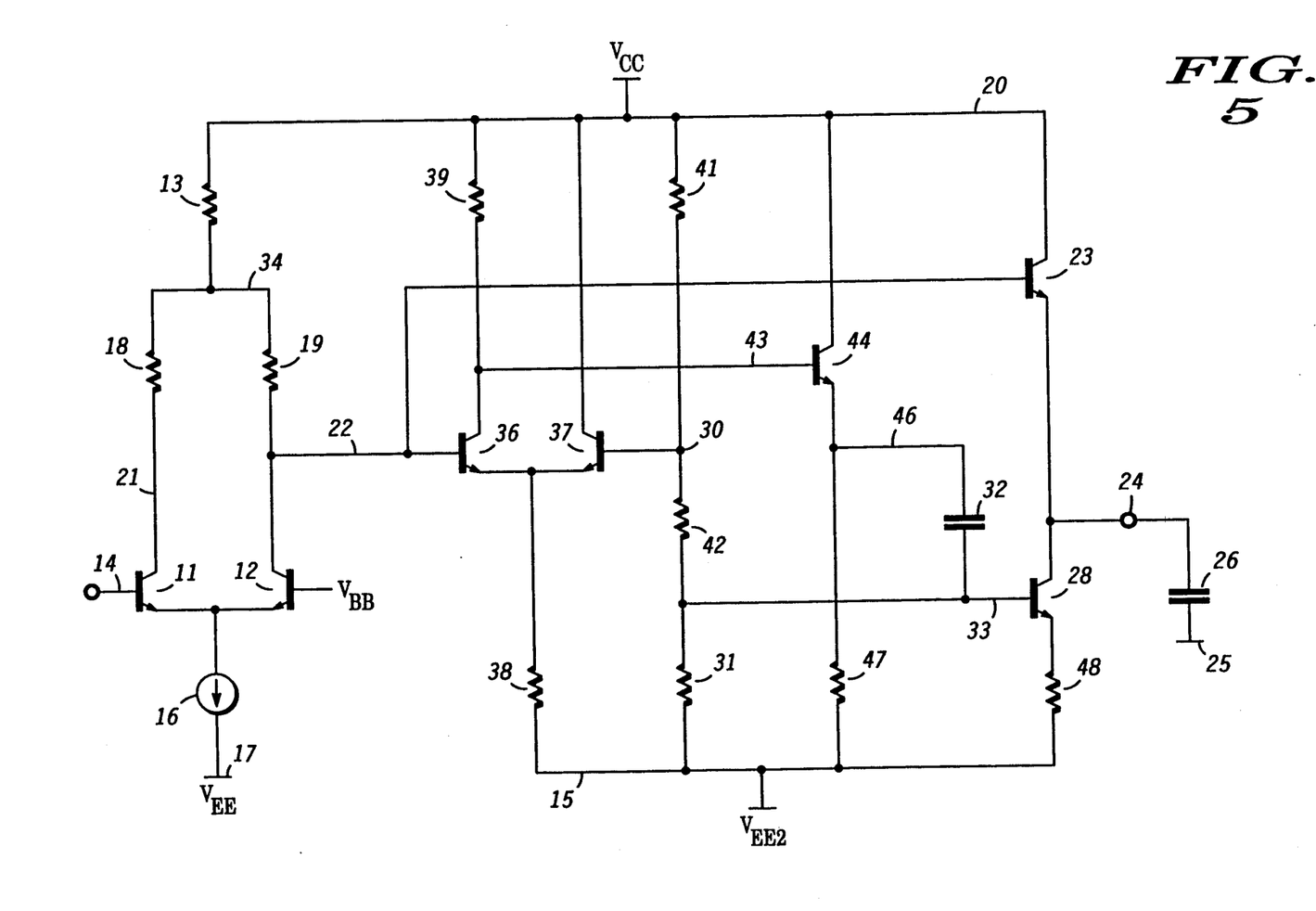
FIG. 5 is a schematic diagram of an ECL gate circuit including an additional alternate embodiment of the circuit of FIG. 3.

An additional alternate embodiment of the present invention is illustrated in FIG. 5. The operation of the input stage, inverter stage, and output active pull-up and pull down devices are identical to FIG. 3. The difference is inn the realization of the pre-biasing function. In FIG. 5, pre-biasing is accomplished by tapping into the voltage divider of the inverter stage, establishing a constant voltage on node 33. Resistor 42 connects between node 30 and node 33. Resistor 31 connects from node 33 to $V_{EE2}$ node 15. The values of resistor 42 and resistor 31 are chosen such that transistor 28 is biased slightly on its quiescent state.

By now, it should be appreciated that there has been provided a unique circuit which provides an innovative method of implementing a relatively fast, consistent active pull-down for logic circuits used in applications which heretofore were restricted to relatively slow or inconsistent switching characteristics. The unique circuit operates at a lower voltage than does the remainder of the logic circuit, thereby reducing the overall power dissipation.

We claim:

1. A logic circuit which comprises:
   an input stage;
   an output stage coupled to the input stage;
   a low-voltage inverter stage coupled to the input stage;
   an active pull-down stage coupled too the low-voltage inverter stage and to the output stage;
   means for pre-biasing the active pull-down stage such that the active pull-down stage is pre-biased to be slightly conductive, wherein the output stage comprises a first transistor having a collector, a base, and an emitter, the collector being coupled to a positive voltage supply terminal, the base being coupled to the input stage, and the emitter being coupled to the active pull-down stage and to an output terminal; and
   wherein the active pull-down stage comprises:
   a second transistor having a collector, a base, and an emitter, the collector being coupled to the output stage and to the output terminal, and the base being coupled to the means for pre-biasing; and
   a first resistor having a first end and a second end, the first end being coupled to the emitter of the second transistor, and the second end being coupled to a negative voltage supply terminal.

2. The logic circuit of claim 1 wherein an output of the inverter stage is coupled to the active pull-down stage by means of:
   an emitter follower having a collector, a base, and an emitter, the collector being coupled to the positive voltage supply terminal, and the base being coupled to the output of the inverter stage.

3. The logic circuit of claim 2 wherein the inverter stage, the active pull-down stage, and the means for pre-biasing operate at a supply voltage less than one half of a supply voltage poor the input stage.

4. The logic circuit of claim 2 wherein the inverter stage comprises:
   a second resistor having a first end and a second end, the first end being coupled to the positive voltage supply terminal;
   a third resistor having a first end and a second end, the first end being coupled t the second end of the second resistor, and the second end being coupled to the negative voltage supply terminal;
   a fourth resistor having a first end and a second end, the first end being coupled to the positive voltage supply terminal;
   a third transistor having a collector, a base, and an emitter, the collector being coupled to the second end of the fourth resistor, and wherein the collector serves as the output of the inverter, and the base being coupled to the input stage;
   a fourth transistor having a collector, a base, and an emitter, the collector being coupled to the positive voltage supply terminal, the base being coupled to the second end of the second resistor and to the first end of the third resistor, and the emitter being coupled to the emitter of the third transistor; and
   a fifth resistor having a first end and a second end, the first end being coupled to the emitters of the third and fourth transistors, and the second end being coupled to the negative voltage supply terminal; and
   a sixth resistor having a first end and a second end, the first end being coupled to the emitter of the emitter follower, and the second end being coupled to the negative voltage supply terminal.

5. The logic circuit of claim 4 wherein the means for pre-biasing the active pull-down device comprises:
   a fifth transistor having a collector, a base, and an emitter, the collector being coupled to the base;
   a sixth transistor having a collector, a base, and an emitter, the collector being coupled to the positive voltage supply terminal, the base being coupled to the collector and the base of the fifth transistor, and the emitter being coupled to the active pull-down stage;
   a seventh transistor having a collector, a base, and an emitter, the emitter being coupled to the negative voltage supply terminal, the collector being coupled to the base, and further being coupled to the emitter of the fifth transistor;
   an eighth transistor having a collector, a base, and an emitter, the emitter being coupled to the negative voltage supply terminal, the collector being coupled to the emitter of the sixth transistor and to the active pull-down stage, and the base being coupled to the base and collector of the seventh transistor and to the emitter of the fifth transistor; and
   a current source coupled between the positive voltage supply terminal and the collector and base of the fifth transistor and the base of the sixth transistor such that ten to fifty microamps of current are sourced.

6. The logic circuit of claim 4 wherein the means for pre-biasing the active pull-down device comprises:
   a fifth transistor having a collector, a base, and an emitter, the collector being coupled to the base;
   a sixth transistor having a collector, a base, and an emitter, the collector being coupled to the positive voltage supply terminal, the base being coupled to the collector and the base of the fifth transistor, and the emitter being coupled to the active pull-down stage;

a seventh transistor having a collector, a base, and an emitter, the emitter being coupled to the negative voltage supply terminal, the collector being coupled to the base, and further being coupled to the emitter of the fifth transistor;

an eighth transistor having a collector, a base, and an emitter, the emitter being coupled to the negative voltage supply terminal, the collector being coupled to the emitter of the sixth transistor and to the active pull-down stage, and the base being coupled to the base and collector of the seventh transistor and to the emitter of the fifth transistor; and a ninth transistor having a source, a gate, and a drain, the source being coupled to the positive voltage supply terminal, the gate being coupled to the negative voltage supply terminal, and the drain being coupled to the collector and base of the fifth transistor and the base of the sixth transistor such that ten to fifty microamps of current are sourced.

7. The logic circuit of claim 4 wherein the means for pre-biasing the active pull-down device comprises:

a fifth transistor having a collector, a base, and an emitter, the collector being coupled to the base, and the emitter being coupled to the negative voltage supply;

a sixth resistor having two ends, the first end being coupled to the collector and base of the fifth transistor, and the second end being coupled to the active pull-down stage; and a current source coupled between the emitter of the emitter follower, and the collector and base of the fifth transistor such that ten to fifty microamps of current are sourced.

8. The logic circuit of claim 4 wherein the means for pre-biasing the active pull-down device comprises:

a fifth transistor having a collector, a base, and an emitter, the collector being coupled to the base, and the emitter being coupled to the negative voltage supply;

a sixth resistor having two ends, the first end being coupled to the collector and base of the fifth transistor, and the second end being coupled to the active pull-down stage; and a sixth transistor having a source, a gate, and a drain, the source being coupled to the collector and base of the fifth transistor, the gate being coupled to the positive voltage supply terminal, and the drain being coupled to the emitter of the emitter follower, such that ten to fifty microamps of current are sourced.

9. The logic circuit of claim 2 wherein the inverter stage comprises:

a second resistor having a first end and a second end, the first end being coupled to the positive voltage supply terminal;

a third resistor having a first end and a second end, the first end being coupled to the second end of the second resistor;

a fourth resistor having a first end and a second end, the first end being coupled to the second end f the third resistor, and the second end being coupled to the negative voltage supply terminal;

a fifth resistor having a first end and a second end, the first end being coupled to the positive voltage supply terminal;

a third transistor having a collector, a base, and an emitter, the collector being coupled to the second end of the fifth resistor, wherein the collector serves as the output of the inverter, and the base being coupled to the input stage;

a fourth transistor having a collector, a base and an emitter, the collector being coupled to the positive voltage supply terminal, the base being coupled to the second end of the second resistor and to the first end of the third resistor, and the emitter being coupled to the emitter of the third transistor;

a sixth resistor having a first end and a second end, the first end being coupled to the emitters of the third and fourth transistors, and the second end being coupled to the negative voltage supply terminal; and a seventh resistor having a first end and a second end, the first end being coupled too the emitter of the emitter follower, and the second end being coupled to the negative voltage supply terminal.

10. The logic circuit of claim 9 wherein the active pull-down stage couples to the second end of the third resistor and to the first end of the fourth resistor.

11. An emitter coupled logic circuit which comprises:

a first negative power supply terminal providing a first power supply voltage;

a second negative power supply terminal providing a second power supply voltage, the second power supply voltage being less than half of the first power supply voltage;

an input stage coupled to the first negative power supply terminal;

at least one output stage coupled to the input stage;

at least one active pull-down stage coupled to the at least one output stage, and further coupled to the second negative power supply terminal; and means for pre-biasing the active pull-down stage such that the active pull-down stage is pre-biased to be slightly conductive.

12. An emitter-coupled logic circuit which comprises:

ann input stage;

an output terminal;

means for active pull-up coupled to the input stage and to the output terminal;

means for active pull-down coupled to the output terminal;

means for inverting an output of the input stage coupled to the input stage and to the means for active pull-down;

means for pre-biasing the means for active pull-down to a slightly conductive state, coupled to the means for active pull-down; and wherein the means for inverting an output of the input stage comprises:

a voltage divider; and a differential amplifier with two inputs and an output, the first input being coupled to the output of the input stage, the second input being coupled to the voltage divider, and the output being coupled to the means for active pull-down.

13. The logic circuit of claim 12 wherein an output of the means for inverting an output of the input stage couples to the means for active pull-down by means of:

a transistor having a collector, a base, and an emitter, the collector being coupled to a positive voltage supply terminal, and the base being coupled to the output of the means for inverting an output of the input stage; and a capacitor having two ends, the first end being coupled to the emitter of the transistor, and the second end being coupled to the means for active pull-down.

14. The logic circuit of claim 12 wherein the means for pre-biasing the active pull-down comprises:

a first transistor having a collector, a base, and an emitter, the collector being coupled to the base;

a second transistor having a collector, a base, and an emitter, the collector being coupled to the positive voltage supply terminal, the base being coupled to the collector and the base of the first transistor, and the emitter being coupled to the means for active pull-down;

a third transistor having a collector, a base, and an emitter, the emitter being coupled to the negative voltage supply terminal, and the collector being coupled to the base, and further being coupled to the emitter of the first transistor;

a fourth transistor having a collector, a base, and an emitter, the emitter being coupled to the negative voltage supply terminal, the collector being coupled to the emitter of the second transistor and to the means for active pull-down, and the base being coupled to the base and collector of the third transistor and to the emitter of the first transistor; and a fifth transistor having a source, a gate, and a drain, the source being coupled to the positive voltage supply terminal, the gate being coupled to the negative voltage supply terminal, and the drain being coupled to the collector and base of the first transistor and the base of the second transistor such that ten to fifty microamps of current are sourced.

15. A method for providing a fast and consistent active pull down for an output of a logic circuit, comprising:

inverting an output of an input stage;

coupling the inverted output of the input stage transiently to a means for active pull-down;

pre-biasing the means for active pull-down to a slightly conductive state; and wherein the method for pre-biasing the means for active pull-down comprises:

establishing a reference current of ten to fifth microamps;

mirroring the reference current inn such a manner as to establish a reference voltage; and coupling the reference voltage too the means for active pull-down, such that means for active pull-down, while in a quiescent state, sinks a current equal to the reference current.

* * * * *